United States Patent [19]
Wittig et al.

[11] Patent Number: 6,141,384
[45] Date of Patent: Oct. 31, 2000

[54] DECODER FOR TRELLIS ENCODED INTERLEAVED DATA STREAM AND HDTV RECEIVER INCLUDING SUCH A DECODER

[75] Inventors: Karl Raymond Wittig, New York; Samir Narayan Hulyalkar, Ossining, both of N.Y.

[73] Assignee: Philips Electronics North America Corporation, New York, N.Y.

[21] Appl. No.: 08/800,637

[22] Filed: Feb. 14, 1997

[51] Int. Cl.[7] .................................................... H04N 7/12
[52] U.S. Cl. ..................... 375/240.25; 375/262; 375/265
[58] Field of Search ................... 348/426, 555, 348/558; 375/262, 265, 341, 240.25; H04N 7/12

[56] References Cited

U.S. PATENT DOCUMENTS

| | | | |
|---|---|---|---|
| 5,291,499 | 3/1994 | Behrens et al. | 371/43 |
| 5,583,889 | 12/1996 | Citta et al. | 375/341 |
| 5,717,471 | 2/1998 | Stewart | 348/555 |
| 5,796,756 | 8/1998 | Choi et al. | 371/43.7 |

FOREIGN PATENT DOCUMENTS

0677967A2  10/1995  European Pat. Off. .

OTHER PUBLICATIONS

Advanced Television Systems Committe, Digital Television Standard for HDTV Transmission, Apr. 1995, Annex D, RF/Transmission Characteristics.

H. Taub and D.L. Schilling, Principle of Communication Systems, 2d ed., New York, McGraw Hill, pp. 562–575.

H. Lou, and J. M. Cioffi, "A Programmable Parallel Arithmetic Processor for Viterbi Detection," GLOBECOM '90, 1990.

C.M. Rader, "Memory Management in a Viterbi Decoder," IEEE Transactions on Communications, vol. COM–29, No. 9, pp. 1399–1401, Sep. 1981.

G. Ungerboeck, "Trellis–Coded Modulation with Redundant Signal Sets, Part I: Introduction, Part II: State of the Art", IEEE Communications Magazine, vol. 25, pp. 5–21, Feb. 1987.

Dae–il Oh, et al, A VLSI Architecture of the Trellis Decoder Block For the Digital HDTV Grand Alliance System, IEEE Trans. Cnsmr. Elecs., vol. 42, No. 3, Aug. 1996.

*Primary Examiner*—Young Lee
*Attorney, Agent, or Firm*—Leroy Eason

[57] ABSTRACT

In the standard format now adapted by FCC for a digital HDTV signal, the video data symbols are interleaved and trellis encoded in accordance with a 4-state trellis code and the interleaving is of sequences of every 12 successive symbols. At the receiver the trellis decoder is therefore projected to consist of 12 respective decoder stages for the 12 interleaved sequences, each decoder stage having a branch metric calculator unit (BMC), an add-compare-select (ACS) unit and a path memory unit (PMU). The present invention separates the path memory requirements for the 12 interleaved sequences from the requisite BMC and ACS functions, so that the latter two units can provide those functions for all of the 12 interleaved sequences. A single extended PMU provides for storage of pointers to possible predecessor states of the trellis code corresponding to a present state thereof, going back to a predetermined number (such as 16) of sequentially preceding received symbol values. The PMU also provides, in each of the storage stages, sequential storage elements corresponding to the sequential interleaved symbol values. This makes it possible for the PMU to be realized as a single integrated RAM by appropriate grouping of the trellis code states. Also, the ACS function is performed by two separate ACS units for two mutually independent groups of trellis code states.

20 Claims, 14 Drawing Sheets

| | PRESENT STATE | NEW STATE | CODED OUTPUT |
|---|---|---|---|
| X1 | D1 D0 | D1 D0 | Z1 Z0 |
| 0 | 0 0 | 0 0 | 0 0 |
| 0 | 0 1 | 1 0 | 0 1 |
| 0 | 1 0 | 0 1 | 0 0 |
| 0 | 1 1 | 1 1 | 0 1 |
| 1 | 0 0 | 0 1 | 1 0 |
| 1 | 0 1 | 1 1 | 1 1 |
| 1 | 1 0 | 0 0 | 1 0 |
| 1 | 1 1 | 1 0 | 1 1 | ns
DECODER FOR TRELLIS ENCODED INTERLEAVED DATA STREAM AND HDTV RECEIVER INCLUDING SUCH A DECODER

BACKGROUND OF THE INVENTION

1. Field of the Invention

The present invention relates to a receiver for a digital HDTV signal having successive data frames each of which has successive data segments, each segment including a series of data symbols, successive data symbols in each segment being interleaved and trellis encoded in accordance with a multi-level constellation of permissible code values. More particularly, the invention relates to a trellis decoder for decoding trellis encoded interleaved data symbols in a received data stream.

Such a trellis encoded interleaved format has recently been adopted by the Federal Communications Commission as an HDTV broadcasting standard in the United States.

2. Description of the Related Art

After years of intensive cooperative effort by the television industry, as represented by the Digital HDTV Grand Alliance (GA) of leading manufacturing and research organizations in that field, the GA developed and submitted to the FCC Advisory Committee on Advanced Television Service a proposed standard documenting a digital HDTV system. Such standard (the "GA standard"), with little change, has now become the official FCC broadcasting standard for HDTV.

It calls for 2-bit data symbols of the HDTV signal to be trellis encoded in accordance with an 8-level (3 bit) one-dimensional constellation. One bit of each data symbol is precoded, and the other is subjected to a ½ encoding rate which produces two coded bits in accordance with a 4-state trellis code. For purposes of interleaving, twelve identical encoders and precoders operate successively on every twelve successive data symbols. Symbols 0, 12, 24, 36 . . . are encoded as one series; symbols 1, 13, 25, 27 . . . as a second series; symbols 2, 14, 26, 38 . . . as a third series; and so on for a total of 12 series. It is suggested, therefore, in the GA standard, that 12 trellis decoders will also be required in the receiver for the 12 series of time division interleaved data symbols in the signal, each decoder decoding every 12th in the stream of coded data symbols.

Each of the decoders for the 4-state trellis code will operate in accordance with the well-known Viterbi decoding algorithm and so typically involves three separate units: a branch metric calculator unit, an add-compare-select unit, and a path-memory unit. See, for example, "Trellis-coded Modulation With Redundant Signal Set, Part I; Introduction, Part II: State of the Art", G. Ungerboeck, IEEE Communications Magazine, Vol. 25, pp. 5–21, February 1987. However, if twelve decoders are to be provided the resulting complete decoder circuitry is quite extensive and would occupy considerable space on an integrated circuit chip.

SUMMARY OF THE INVENTION

The invention is based on Applicants' perception that it is feasible to provide a trellis decoder for interleaved data streams wherein the "memoryless" functionality of the decoding channel for each stream is separated from the requisite path memory, so that such functionality can be combined for all channels. Such a combination of the memoryless functionality of all decoding channels makes possible a very compact integrated circuit arrangement.

A trellis decoder in accordance with the invention is adapted for decoding each of a plurality of interleaved series of data symbols, each series having been trellis encoded in accordance with a multi-level constellation of permissible trellis code values. Such a decoder comprises a branch metric calculator for deriving for each series the branch metrics of each of the trellis states as successively determined for successive data symbols in such series. The branch metric and trellis state information is supplied to an add-compare-select (ACS) unit which determines therefrom best metric paths which are successively up-dated for each series in accordance with successive received data symbols in each series. The decoder also comprises successive path memory stages, the outputs of each stage being the inputs of the next succeeding stage, each stage receiving from its predecessor and storing a pointer identifying the path having the best metric through the trellis for the previously received data symbol in each of said series, the first stage receiving from the ACS unit and storing a pointer identifying the path having the best metric through the trellis for currently received data symbols in each of said series. The final memory stage thereby will have stored therein pointer for the trellis states corresponding to the earliest of the data symbols in each of the series of stored trellis states in all of the path memory stages, from which trellis states the fully decoded value of said earliest data symbol is indicated.

According to one feature of the invention the decoder makes use of the fact that for certain trellis codes, including the 4-state code of the GA standard, the trellis states can be divided into a plurality of distinct groups such that the states existing at any time in a given group can only have resulted from preceding trellis states within that same group. In addition, any existing state can only have resulted from a small number of possible predecessor states. Codes having both those characteristics are called "well-defined" codes. In particular, for a large number of well-defined codes, the number of possible predecessor states depends on the number of trellis coded input bits. That number is one in the GA standard and in the majority of trellis codes presently in use, and hence the number of possible predecessor states in those codes is only two. The 4-state trellis code of the GA standard is an example of a well-defined code, whereby it is possible to provide two ACS sub-units to respectively derive best metric path data for only the two trellis states in respective ones of first and second groups. Each such ACS sub-unit is thereby much simpler in design and operation than would be a single ACS unit for both of said groups. This approach can be taken for well-defined codes of any number of states. For example, with an 8-state code there may be four groups of 2-states each, and four ACS units would each handle one such group.

According to a further feature of the invention, the path memory unit is constituted by successive storage sections in a single RAM, as the simplification of the path memory unit reduces the required input/output by a similar amount.

Another feature of "well-defined" codes which is exploited in the invention is the simplification of the path memory required for each state of the trellis code. Since any existing state could have been reached from only a small number "s" of possible predecessor states, it is not necessary to store a pointer to all possible predecessor states. Instead, a pointer is stored which distinguishes between the small set of possible predecessor states and this requires only a number of memory elements at least equal to $\log_2 s$. Use is made of the information identifying the particular sets to clearly determine the pointer to the previous state. This implies that a small penalty may be paid in terms of extra logic required to determine the pointer to the previous state. However, the second condition of the well-defined code, namely that of distinct groups of code states such that those existing at any time in a given group can only have resulted from previous states in that same group, ensures that the extra logic is actually simpler than would be required to implement a conventional path memory unit. Such simplification can achieve a reduction by a factor of two in regard to the memory required for the 4-state GA code, and reduction by a factor of three in the case of an 8-state code. The saving in memory capacity is therefore substantial.

A further feature of the invention which is specific to the 4-state GA code is that the path memory logic required for selection of a pointer among possible predecessor states at every stage is simplified so that the propagation delay in the combinational logic required for computation of each traceback portion of the overall path is reduced by a factor of two. This has significant advantages in regard to the speed at which the trellis decoder can be operated and results in fewer logic elements.

An HDTV receiver in accordance with the invention is adapted to receive a digital HDTV signal having successive data frames each of which includes successive data segments, each segment including successive data symbols, the data symbols being interleaved to form a plurality of data streams which are each trellis encoded in accordance with a code having a multi-level constellation of permissible code values. Such receiver includes a trellis decoder as described above.

BRIEF DESCRIPTION OF THE DRAWINGS

A more complete description of the invention is set forth below with reference to the accompanying drawings, wherein.

DESCRIPTION OF THE PREFERRED EMBODIMENTS

Figure 1:
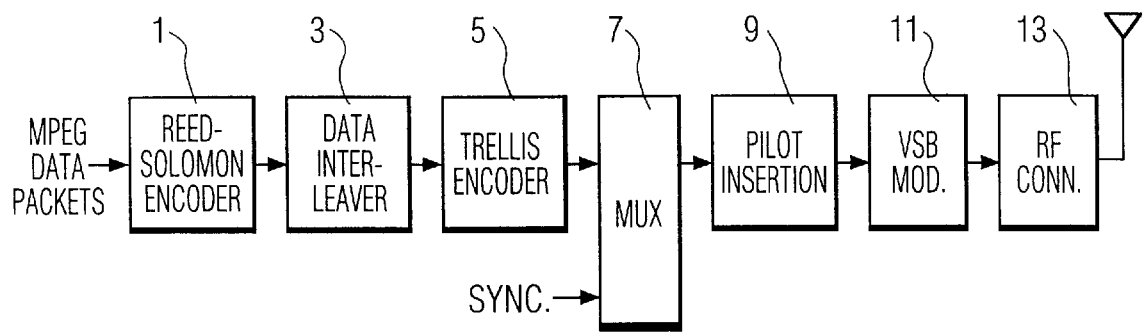
FIG. 1 is a block diagram of an HDTV transmitter in accordance with the GA standard.

FIG. 1 is a block diagram of an HDTV transmitter in accordance with the GA standard. MPEG-compatible data packets are encoded for forward error correction by a Reed Solomon encoder 1. The data packets in successive segments of each data field are then interleaved by data interleaver 3, and the interleaved data packets are then further interleaved and encoded by trellis encoder 5. That results in a stream of data symbols having 3-bits each, one of which is precoded and the other two of which are produced by 4-state trellis encoding. There are actually twelve trellis encoders to provide twelve interleaved coded data sequences. The encoded 3-bit data symbols are then combined with field and segment synchronization bit sequences in multiplexer 7, and a pilot signal is provided by pilot insertion unit 9. The data stream is then subjected to vestigial sideband suppressed carrier 8-level modulation by VSB modulator 11, and finally up-converted to RF by converter 13. A pre-equalizer filter for reduction of interference from NTSC co-channel interfering television signals may optionally be included ahead of the VSB modulator.

Figure 2:
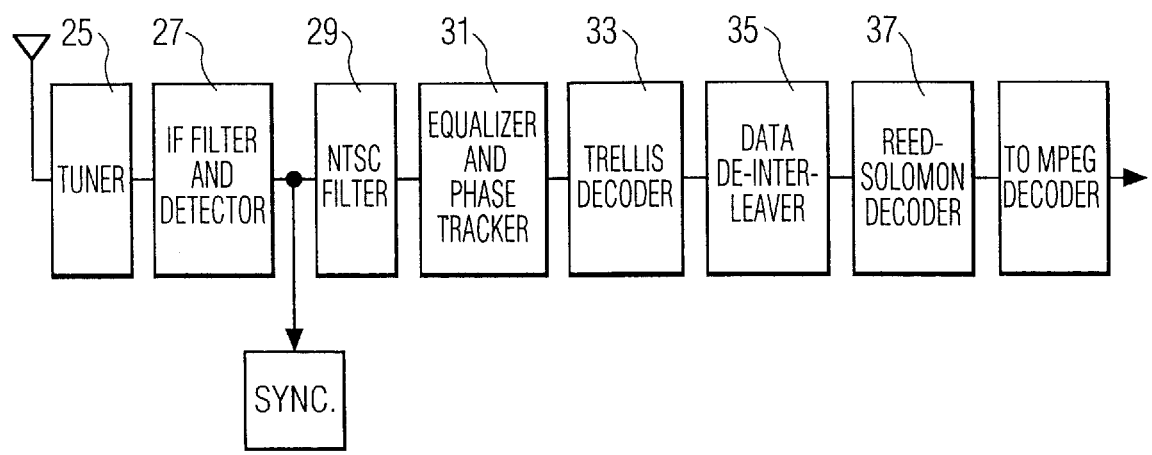
FIG. 2 is a block diagram of an HDTV receiver in accordance with the GA standard.

FIG. 2 is a block diagram of an HDTV receiver in accordance with the GA standard. The received RF signal is down-converted to IF by tuner 25. It is then filtered and converted to digital form by IF filter and detector 27. The detected signal is then in the form of a stream of data symbols which each signify a level in an 8-level constellation. It is then filtered by NTSC rejection filter 29 and subjected to equalization and phase tracking by equalizer and phase tracker 31. At that point the recovered encoded data symbols are subjected to trellis decoding by trellis decoder 33. The decoded data symbols are then further de-interleaved by data de-interleaver 35, and finally subjected to Reed-Solomon decoding by decoder 37. This recovers the transmitted MPEG-compatible data.

Figure 3:
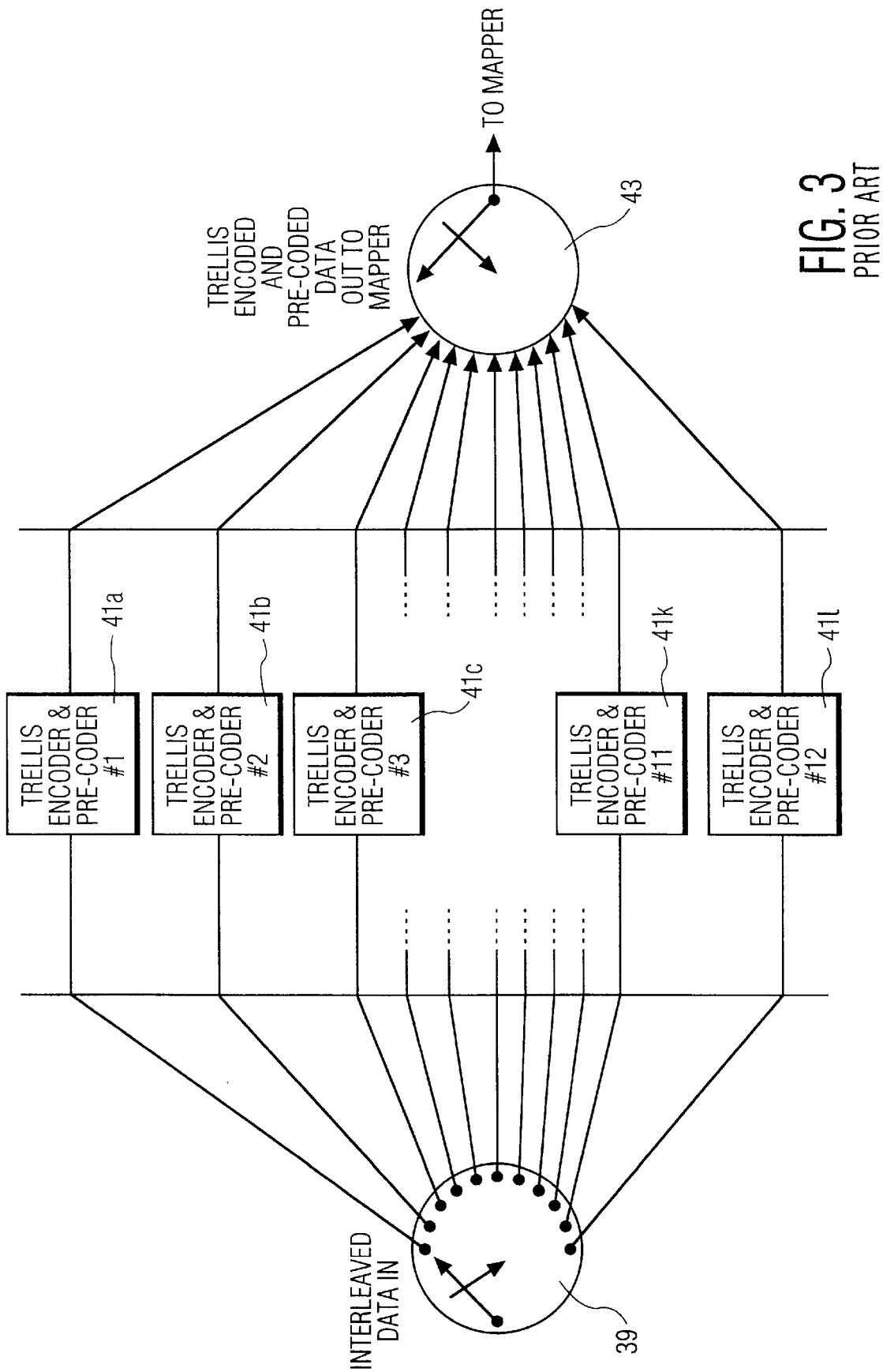
FIG. 3 is a block diagram of the GA trellis interleave consisting of twelve parallel encoder stages for twelve groups of interleaved data symbols.

FIG. 3, which is from page D-7 of the GA standard, shows how the interleaved data from data interleaver 3 in FIG. 1 is further interleaved during trellis encoding. A demultiplexer 39 distributes each successive series of 12 data symbols among 12 successive trellis encoder and pre-coder units 41a, b . . . 41l. The encoded outputs thereof are then time division multiplexed by a multiplexer 43 to form a single data stream.

Figure 4:
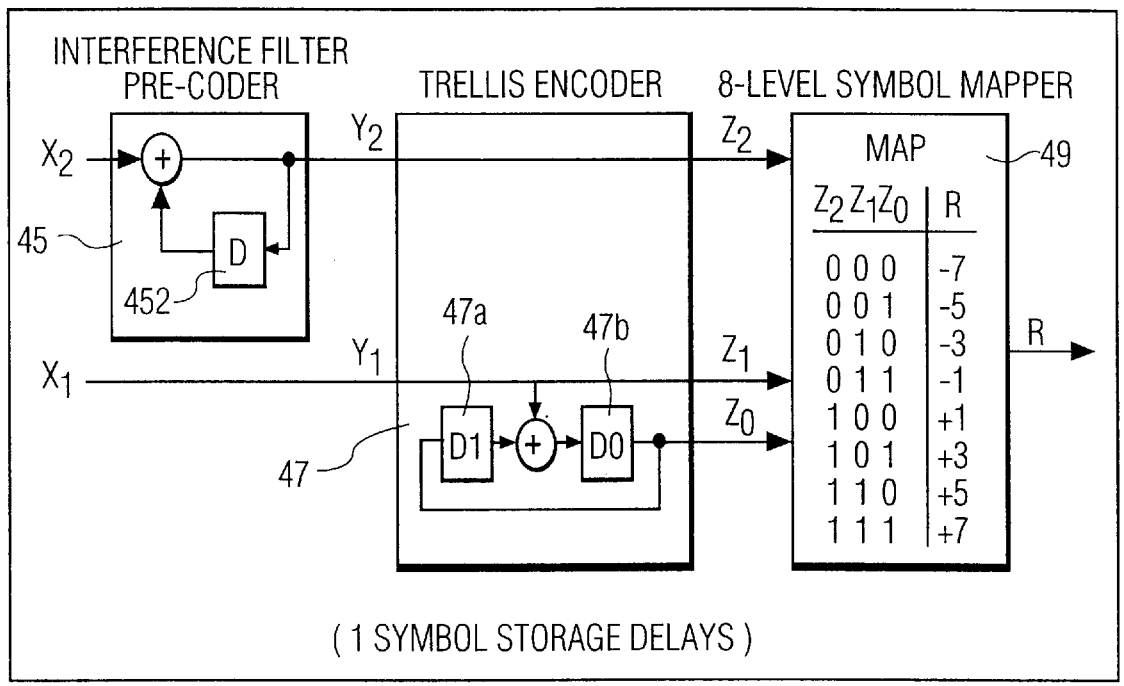
FIG. 4 is a block diagram of each of the twelve encoder stages and associated precoder and 8-level mapper of constellation code values.
Figure 4A:
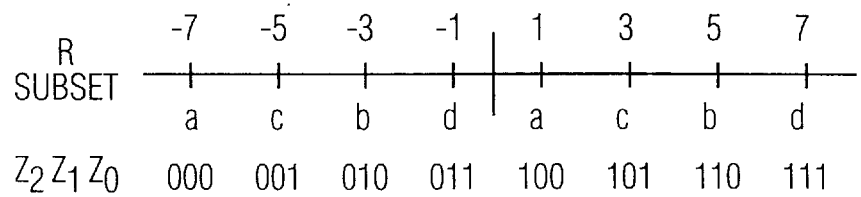
FIG. 4a shows the four subsets a, b, c, d of the constellation code values R.

Each of the trellis code interleavers in FIG. 3 is shown in more detail in FIG. 4. Therein, each data symbol to be encoded includes two bits, $X_1$ and $X_2$. Bit $X_2$ is precoded by a pre-coder 45 which includes a one-bit register 45a to derive precoded bit $Y_2$ which is not altered further by trellis encoder 47 and results in output bit $Z_2$. The other input data bit $X_1$ is trellis encoded by encoder 47 in accordance with a rate ½ trellis code utilizing one-data bit registers 47a and 47b, resulting in output bits $Z_0,Z_1$ Thus, three output bits are produced which are then converted by a digital mapper 49 to a value R in an 8-level constellation of permissible code values. This is done for each of the twelve interleaved series of data symbols. The mapper 49 is simply a look-up table. It is seen that the 8-level constellation has four possible subsets of bits $Z_1,Z_0$, each subset having dual possible constellation values depending whether the precoded $Z_2$ bit is a "0" or a "1". Those subsets and the corresponding constellation values are shown in FIG. 4a. Further details of the encoder and its operation are given in Appendix D of the GA standard. For a basic description of the logic operations involved in trellis encoding/decoding, reference may be had to the text "Principles of Communication Systems", H. Taub et al, 2d Ed., McGraw Hill Book Co., pp. 562–571.

Figure 5A:
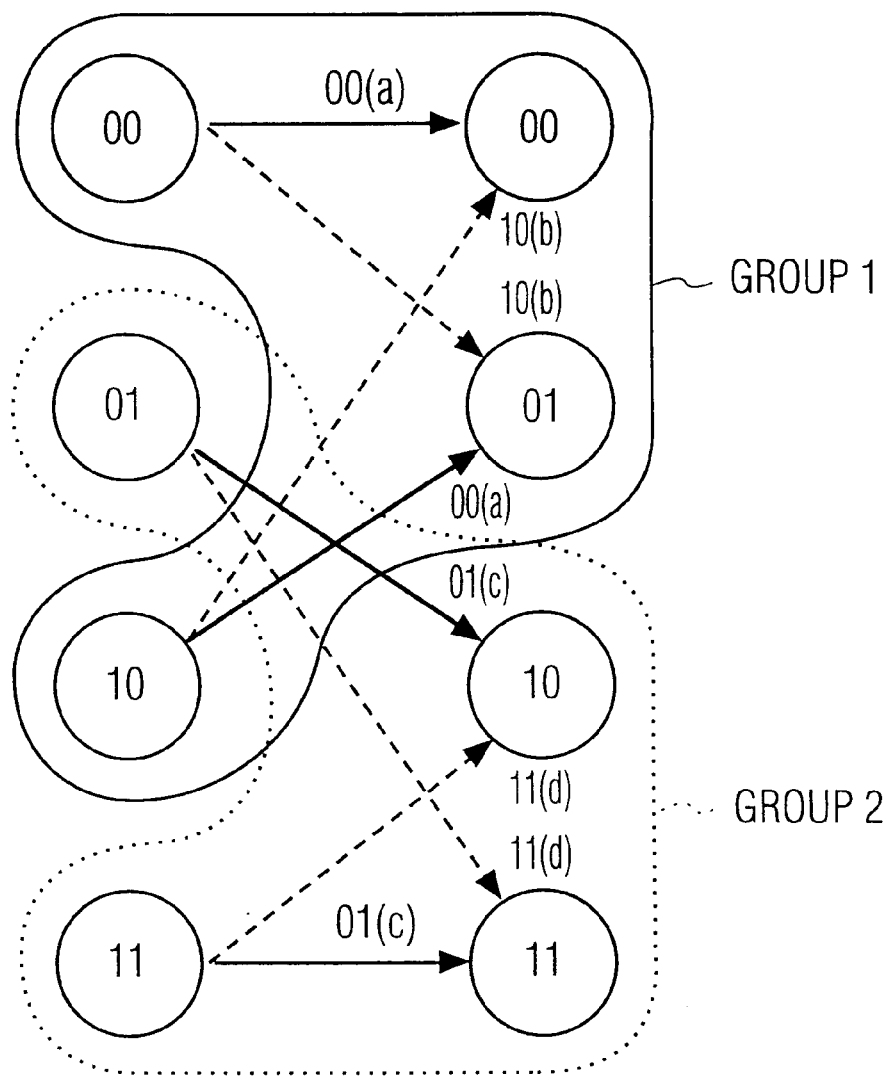
FIGS. 5a, 5b and 5c are respectively a trellis diagram, a state diagram and a trellis code value tabulation applicable to the GA trellis encoder in FIG. 4.
Figures 5B, 5C:
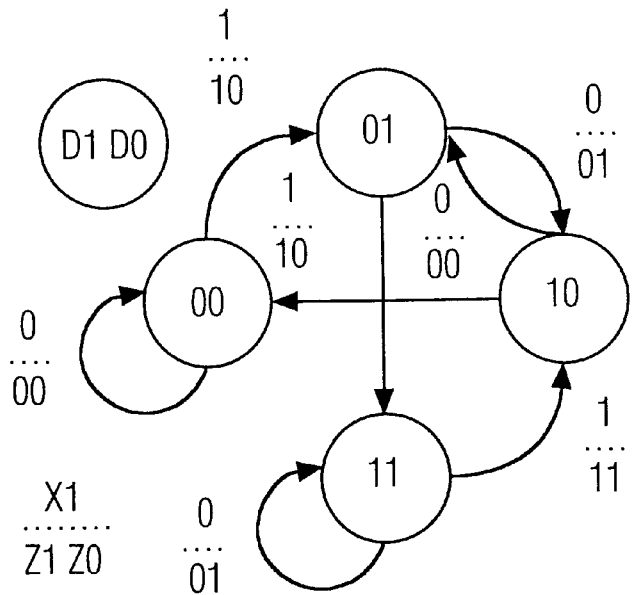

To explain how a single trellis decoder can suffice to decode twelve interleaved series of data symbols obtained from an HDTV signal, reference is made to the 4-state trellis diagram in FIG. 5a. This diagram and the corresponding state diagram in FIG. 5b ignore the precoder 45 in FIG. 4 which supplements the trellis encoder 47, because the precoding has a very simple inverse which is described in the GA standard. The trellis diagram in FIG. 5a relates to the successive values of uncoded bit $X_1$ in FIG. 4 in successive symbol periods. The two active registers 47a and 47b have bit values which during any symbol period determine the 4 possible code states 00,01,10,11. If the next $X_1$ bit is a 0, the present code state will change to the succeeding state indicated by the solid line leaving the present state, and if the aforesaid $X_1$ bit is a 1 the present state will change to the succeeding state indicated by a dash line leaving the present state. The output of the decoder is the $Z_1 Z_2$ subset indicated in each case at the end of the state change line. Thus, for example, if the present code state $D_1$,D0 is 01 and the next $X_1$ bit is a "1", then the next code state D1, D0 will be 10 and the $Z_1,Z_0$ output subset of the decoder will be 01. The precoded bit $Z_2$ received by the decoder serves, as described above, to distinguish between the two possible outputs that can result from each transition between trellis states. The possible coded output subsets $Z_1,Z_0$ resulting from uncoded input bit $X_1$, and the possible transitions between the present (PS) and next (NS) code states $D_1$, $D_0$ are shown in the table in FIG. 5c. For any given code state (i.e. the values $D_1$ $D_0$ of the bits in registers 47a, 47b) only two possible transitions can be produced by the input bit Xl, depending on whether it is a 0 or a 1. As seen in FIG. 5a, given a particular initial code state D1, D0, (which is typically 00) a specific sequence of input bits $X_1$ will select a particular path through the trellis diagram. There are four possible values of output $Z_1,Z_0$, constituting the above-mentioned four subsets a, b, c and d shown in FIG. 4a and also marked on the state transition lines in FIG. 5a. The code states and possible transitions are also shown in the state diagram in FIG. 5b. Each transition line therein is marked with $$\frac{X1}{Z1\ Z0},$$

where X1 is the input bit value and Z1,Z0 is the resulting coded output subset.

A trellis decoder must reconstruct a transmitted sequence of data symbols from a received noise-corrupted encoded version of the transmitted sequence. The first step is to identify the code subset signified by a received symbol. Selection of the nearest of the two constellation points corresponding to that subset is then made by passing the received symbol through a detector having a threshold set at a level exactly halfway between the two constellation points. In this way an accurate determination can be made as to the encoded symbol that was transmitted.

To evaluate a received sequence of coded symbols, the paths through the trellis diagram must be accurately determined. Essentially, from among all possible paths that exist through the trellis diagram the one that comes "closest" to the actual received symbol sequence must be selected. While this might initially seem to require an inordinate number of calculations, a significant simplification is achieved by making use of the Viterbi algorithm. This is described in the text "Principles of Digital Communication and Coding", Viterbi et al, McGraw Hill Book Co. 1979. Basically, according to this algorithm, the number of surviving paths at every stage of the trellis decoding process is equal to the total number of states of the trellis code; i.e., only one surviving path, consisting of the closest match to the actually received sequence, is continued to the following state of the trellis. This is based on the observation that the match between a received sequence and a specific branch in the trellis can be described in terms of a metric, and the branch metrics are additive. The cumulative metric is called the path metric, and is the sum of all the branch metrics. Each branch metric corresponds to the difference between the output corresponding to a specific branch within the trellis diagram in FIG. 5a and the actual received symbol value corresponding to that branch.

Accordingly, a Viterbi decoder requires a branch metric calculator (BMC) unit which calculates a distance (branch metric) in each bit period between a received bit value and the bit values of all the trellis paths leading up to the code state existing during that bit period. The branch metrics are supplied to an add-compare-select (ACS) unit which maintains the accumulated path metrics, one for each of the code states. The ACS unit also determines, for each successive new code state, the path having the minimum (i.e., best) path metric to that state and this path is selected and stored in the form of a pointer in a path memory unit (PMU) defining the new path to that code state. That constitutes the most likely (survivor) trellis path to that code state. Finally, a traceback unit traces back along the accumulated survivor paths to thereby determine the sequence of bits constituting the most likely transmitted data sequence. The number of traceback steps is called the decoding depth, and the oldest bit on the traceback path is output as a decoded bit. The traceback unit must therefore store the aforesaid number of most recent traceback steps, which are in the form of pointers or "decision vectors".

In accordance with the aforesaid description, for every destination state (on the right side of FIG. 5a) the ACS unit must determine the appropriate branch metric to add to the already accumulated path metric going back to the preceding states that end in that destination state, and then select as the surviving path the one having the smallest resultant path metric.

Note that a description of the state transitions which result in the surviving path must be stored following each successive received symbol in a sequence. This consists of the accumulated path metric leading up to the present state, and also the precise sequence of transitions between all previous states in order to arrive at the present state. Clearly, it is impossible to store all possible transitions leading to a given state. A sub-optimal solution is to store all transitions up to a specified number of states preceding the present state. The trellis state transition corresponding to the pointer stored in the path memory unit (PMU) corresponding to the earliest branch which has resulted in the best metric among all the states existing at the current transition is then used to determine the decoded symbol. Such decoded symbol is described by identifying the precoded bit and also which of the subsets a, b, c, or d correspond to the encoded bit as described above. This trellis decoding strategy is well known and is described in the above-referenced textbook by Viterbi and also in the technical paper "A Programmable Parallel Processor Architecture For a Viterbi Detector", H. Lou et al, Globecom, 1990.

The transition history of each surviving path metric is stored in the path-memory unit (PMU). A simplified implementation of the PMU which separates memory-based functions from logic functions thereof is described in the technical paper "Memory Management in a Viterbi Decoder", C. M. Rader, IEEE Trans. Comms., Vol. Com—29 No. 9, September 1981. Basically, the idea is to compute the past state transition sequence best corresponding to the present state. What then needs to be stored for every state is a selective pointer to the best corresponding previous state. These pointers can then be sequentially used to identify the selected branch at the earliest stage of the PMU and consequently the initial decoded symbol in the complete sequence.

Figure 6:
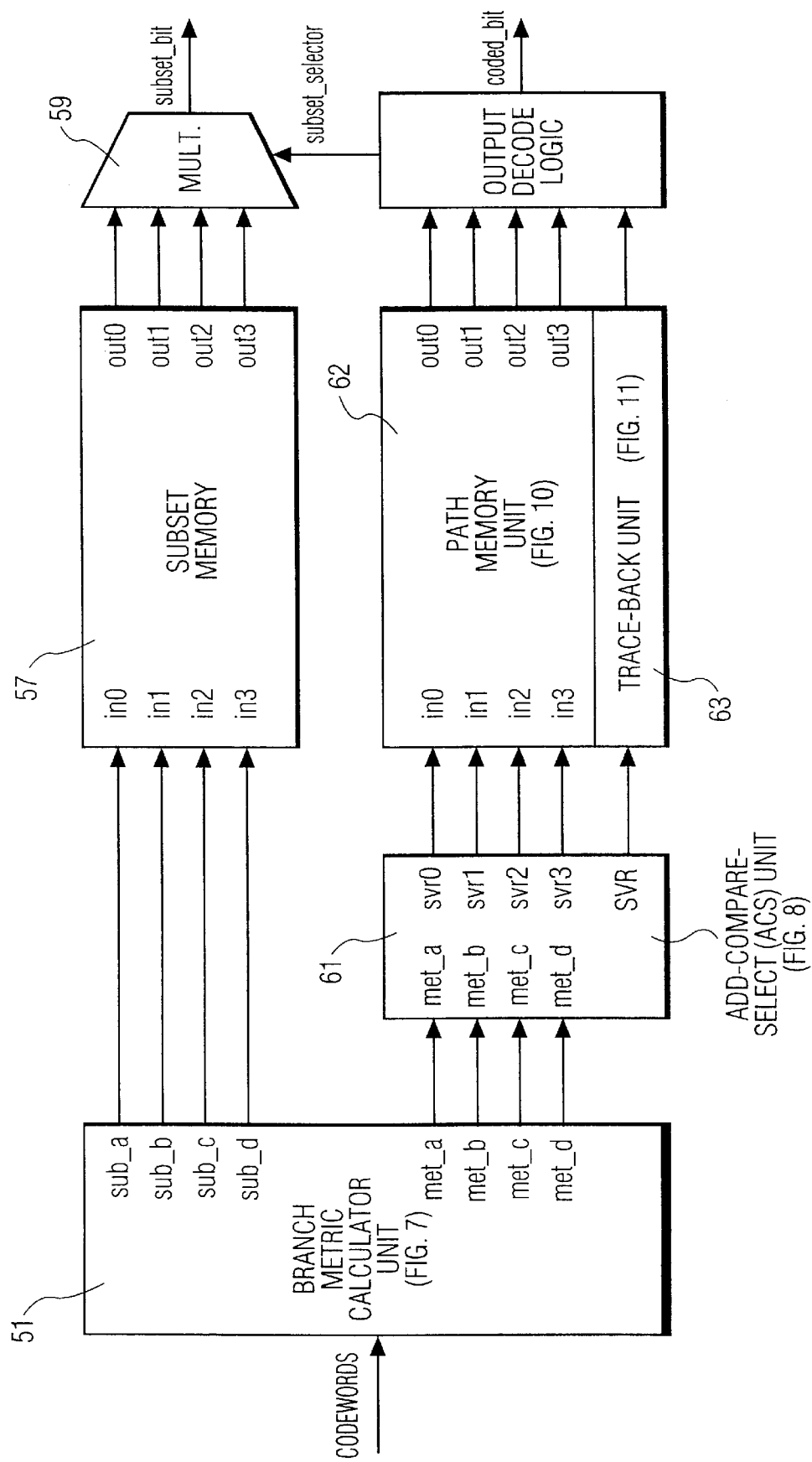
FIG. 6 is a block diagram of a trellis decoder in accordance with the invention.

FIG. 6 shows a trellis decoder implementation in accordance with the invention. It comprises a branch metric calculator (BMC) unit 51 shown in more detail in FIG. 7, an ACS unit 61 shown in more detail in FIG. 8, a path memory unit (PMU) 62 shown in more detail in FIG. 10 and with which is associated a traceback unit 63 shown in more detail in FIG. 11, and a subset memory unit 57. It should be understood that the more detailed circuit implementations of those units as described herein are exemplary only, and that from the functional descriptions given herein it will be apparent to those skilled in the art that various logic circuit implementations of each of those units can be employed.

The input to the BMC unit 51 is a digitized baseband data symbol stream resulting from demodulation and detection of the transmitted 8-level VSB signal described above with reference to the digital receiver in FIG. 2. Each symbol in the stream, in the ideal case of perfect transmission with no channel distortion or noise, will be at one of the 8 discrete levels that make up the constellation of the 8-VSB demodulator, as shown by the mapper block 49 in FIG. 4. In reality, however, noise in the transmission channel affects the value of each symbol. If the noise is very low, the detected symbol value (3 bits) will be closer to the level of the actually transmitted symbol than to any of the other 7 levels, and so in principle could be obtained by simple 8-level slicing. If the noise level exceeds a certain value, however, the detected symbol level may be closer to an incorrect one of the 8 constellation values. It is under these conditions that trellis encoding, wherein the value of each encoded symbol depends on present as well as previous symbol values, achieves significant improvement of the receiver bit error rate.

BMC UNIT

The BMC unit evaluates the "distance" between a received symbol value and the closest of the constellation points signified by each of the four subsets a, b, c, and d described above, which subsets correspond to the four possible values (00, 01, 10 and 11) of the two-bit trellis encoded portion of the received symbol (indicated by Z1Z0 in FIG. 4a). The BMC unit also determines the value (0 or 1) of the "subset" bit, which is the precoded bit indicated by Z2 in FIG. 4a, which corresponds to the closer constellation point. The BMC has four outputs, one for each of the subsets (a, b, c, or d), each such output signifying the "distance" to the nearer of the two constellation points corresponding to the relevant subset, evaluated using a suitable "metric" (designated met-φ in FIG. 6, where φ corresponds to a, b, c, or d). There are also four outputs for the value of the subset (precoded) bit (designated sub-φ in FIG. 6) for each of the subsets.

Figure 7:
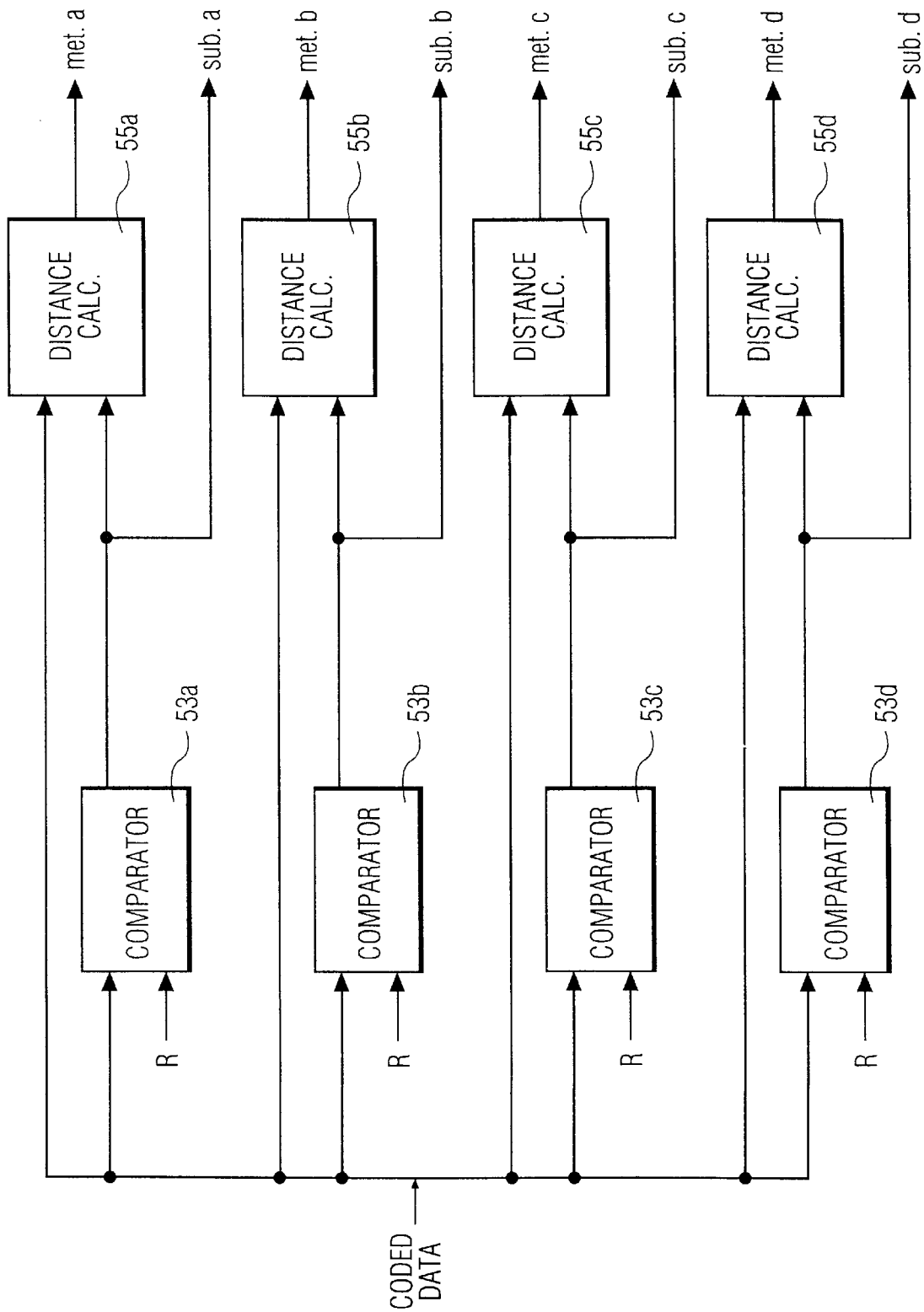
FIG. 7 is a block diagram of the branch metric calculator in the decoder in FIG. 6.

At this stage it is assumed that the actual transmitted symbol is unknown because of the presence of channel noise, and that it could be in any one of the four possible output subsets. The BMC may be implemented using conventional digital signal processing hardware as shown in FIG. 7. Alternatively, a ROM based lookup table can be used, resulting in less hardware and permitting future use of a different "distance metric" without otherwise modifying the design of the trellis decoder.

Referring to the circuit implementation of the BMC in FIG. 7, it has four paths corresponding to the four subsets a, b, c, d.

Figure 10:
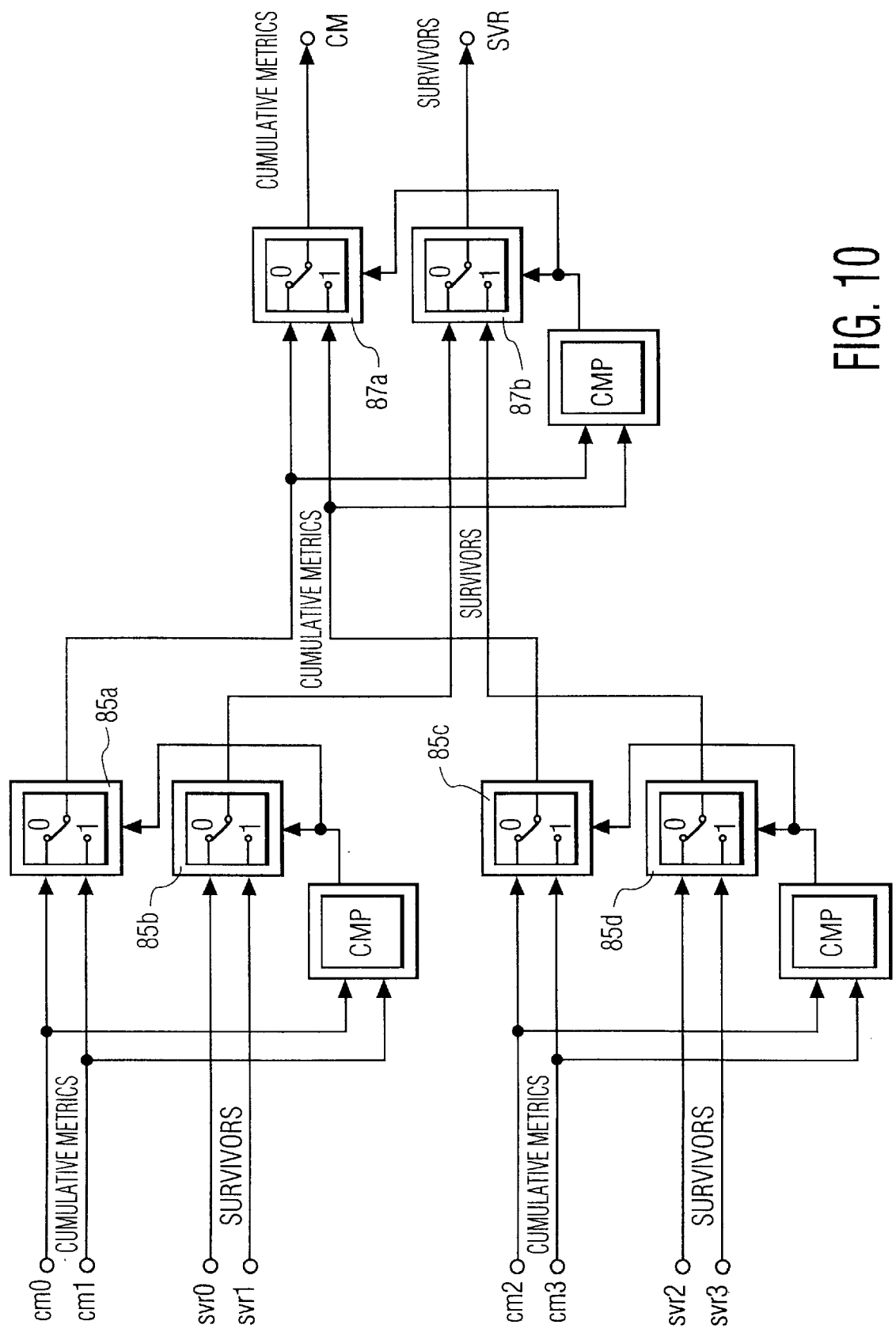
FIG. 10 is a block diagram of the best metric selection logic of the ACS logic units in FIG. 8.

Each path includes a comparator 53a–53d which is supplied with the values R of the eight constellation points and also with the received symbol value. The comparator for each subset determines which of the constellation points for that subset is nearest to the received symbol, and supplies that information along with such symbol to a distance calculator which is one of four such calculators 55a–55d which calculate the distance between the nearest constellation point and the received symbol in the relevant subset. That distance is the "branch metric", and is output from the relevant calculator together with the associated subset bit. The subset bit for each of the four subsets is supplied, designated sub-φ as shown in FIG. 6, to the subset memory unit 57 the outputs of which are supplied to a multiplexer 59 which outputs the subset bit corresponding to the transition at the last stage of a series of sixteen path memory unit stages as shown in FIG. 10. The path metric values output from BMC unit 51 (designated met-φ) are supplied, as shown in FIG. 6, to the ACS unit 61.

In cases where the resolution of the trellis decoder is limited to a reasonable number of bits, the entire BMC unit can be replaced by a single ROM lookup table. For the case of eight bits, which is fairly typical, a ROM with only 256 locations is needed. Its output bus width corresponds to the resolution of the output metric, which is typically 6 or 7 bits, plus 1 bit for the subset output, multiplied by the number of subsets, which is 4, for a total of 28 or 32 bits, respectively. Such an implementation has the advantage, when the input resolution is not very high, that it will require less area on an integrated circuit than the direct implementation of a logic circuit as in FIG. 7 which requires calculators and comparators. Also, in the latter case, the computation hardware must provide adequate precision; use of a ROM eliminates these considerations since all intermediate computations are taken into account when the lookup table is designed and thus can have any degree of precision desired. Finally, the type of branch metric used is not restricted to the Euclidean metric used for direct computation, so that use of a ROM permits a different metric to be used, if desired, without otherwise changing the design of the trellis decoder.

ACS UNIT

Pursuant to the Viterbi algorithm, for each of the four possible subsets the corresponding state of the trellis encoder must be determined as defined by D1, D0 in the trellis coder in FIG. 4, along with all possible previous states from which the current state could be reached (as shown in the trellis diagram of FIG. 5a). For the described trellis code, each present state has only two possible predecessor states. The one which has the smaller "cumulative metric" is chosen, and the value (D1, D0) of this state is stored in memory as the predecessor of the present state for the relevant subset. A succession of such predecessor states can thus be constructed over a "path length" consisting of the most recent L symbols (a value of 16 for L is well suited to the 8-VSB demodulator). One such path is needed for each of the four possible subsets, and a "cumulative metric" consisting of the sum of the branch metrics for each selected state transition within a given path must be maintained for each such path. Of the four possible paths, the one with the smallest cumulative metric is designated the "survivor path". Its earliest stored state is used to determine the value of the earliest coded bit that was originally input to the trellis encoder.

The above metric computations are performed by the ACS unit 61 in FIG. 6. This has as its input the four subset branch metrics (once again designated met-φ). It updates the cumulative metric for each of the four paths stored in the path memory unit 62, performs the comparisons to select the best predecessor state for each of the four possible current states as well as the current survivor path, and outputs the four predecessor states (designated svr 0, svr 1, svr 2, and svr 3) to the path memory unit 62 and also outputs the survivor path (designated SVR) to the traceback unit 63.

Figure 8:
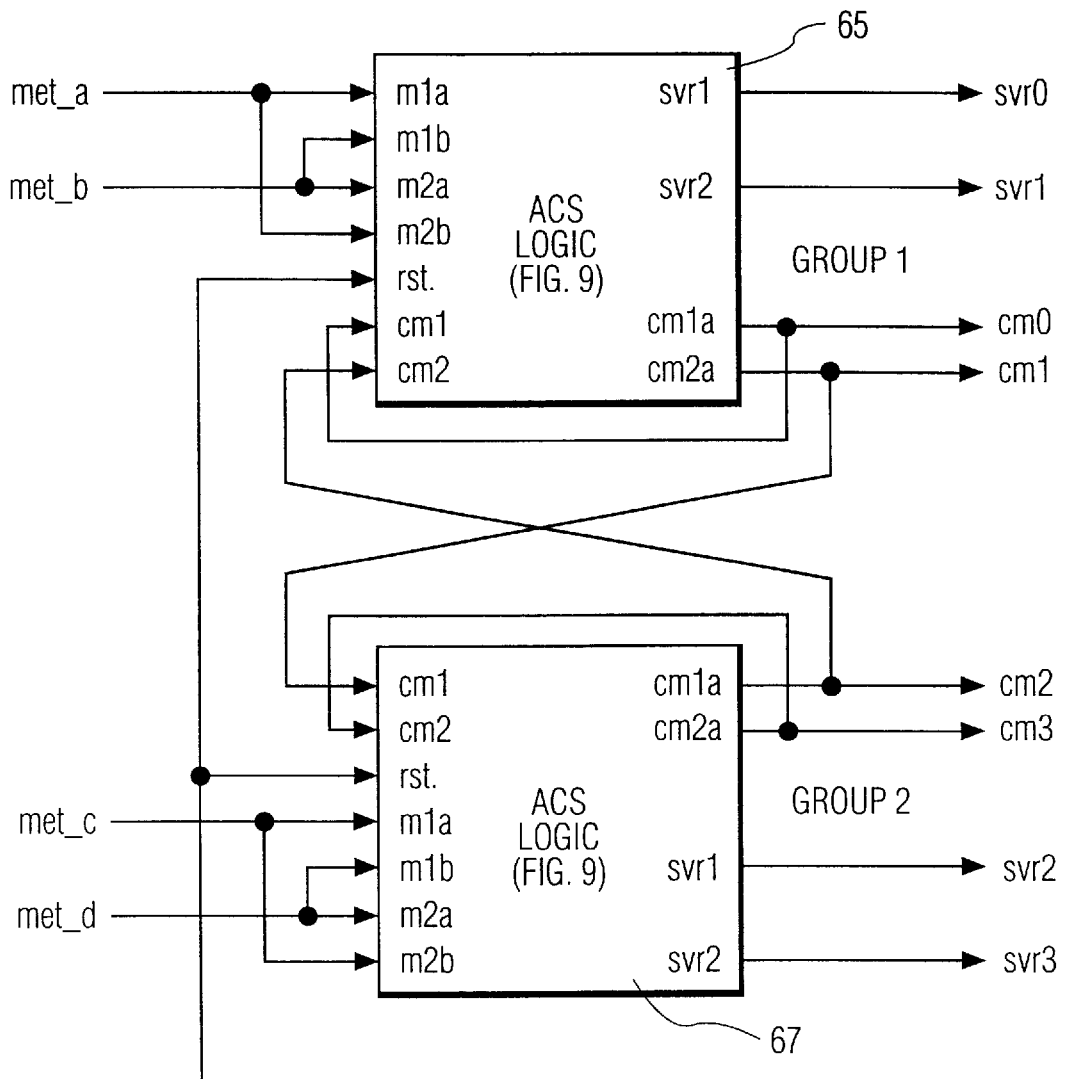
FIG. 8 is a block diagram of the add-compare-select (ACS)unit in the decoder in FIG. 6.
Figure 8:
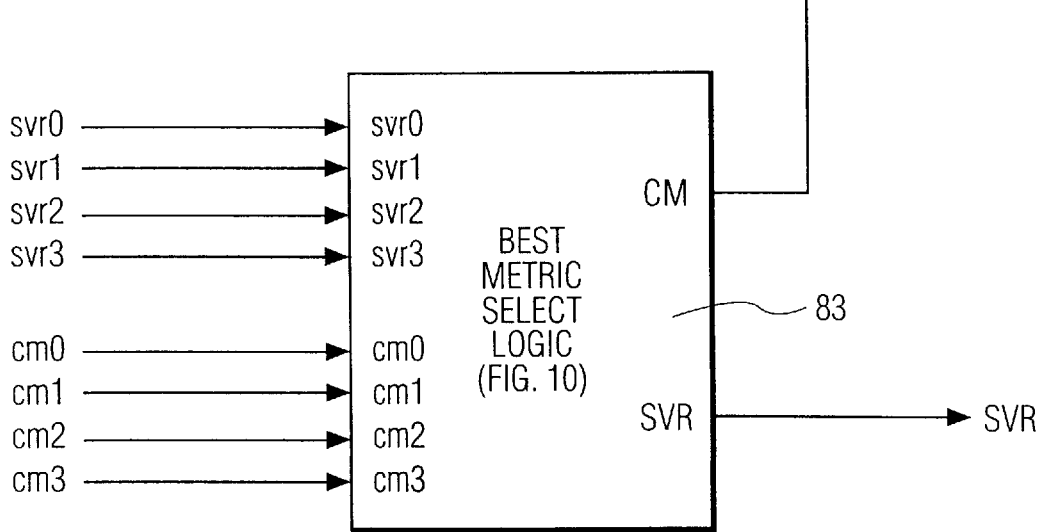

The ACS unit is shown in more detail in FIG. 8. As already noted above, it is seen from the trellis diagram of FIG. 5a that each present trellis state has exactly two possible predecessor states. It is also seen in FIG. 5a that the trellis diagram itself can be partitioned into two groups, designated group 1 and group 2, such that transitions to a present state within either of such groups only occur from previous states which are also within that same group. This separation permits the ACS unit to be partitioned into two independent sections 65 and 67 which, since the two trellis groups are symmetrical, will themselves also be identical. Thus, a single potentially complicated ACS unit can be implemented using two much simpler sub-units of identical design. This is a significant advantage provided by the decoder of the present invention.

Each ACS logic circuit 65, 67 has as its inputs the branch metrics for two of the four subsets along with the cumulative metrics for the two predecessor states that are in the same trellis group (designated cm 1 and cm 2). It uses this information to select the appropriate predecessor state for each of the two subsets (that which results in a smaller cumulative metric for that subset), and computes and maintains the cumulative metrics for the paths corresponding to the two subset states. It outputs their values along with the identities of the corresponding "survivor" predecessor states. The latter are then stored in the path memory unit, and both sets of outputs (i.e. all four) are used to determine the current survivor path among the four.

Figure 9:
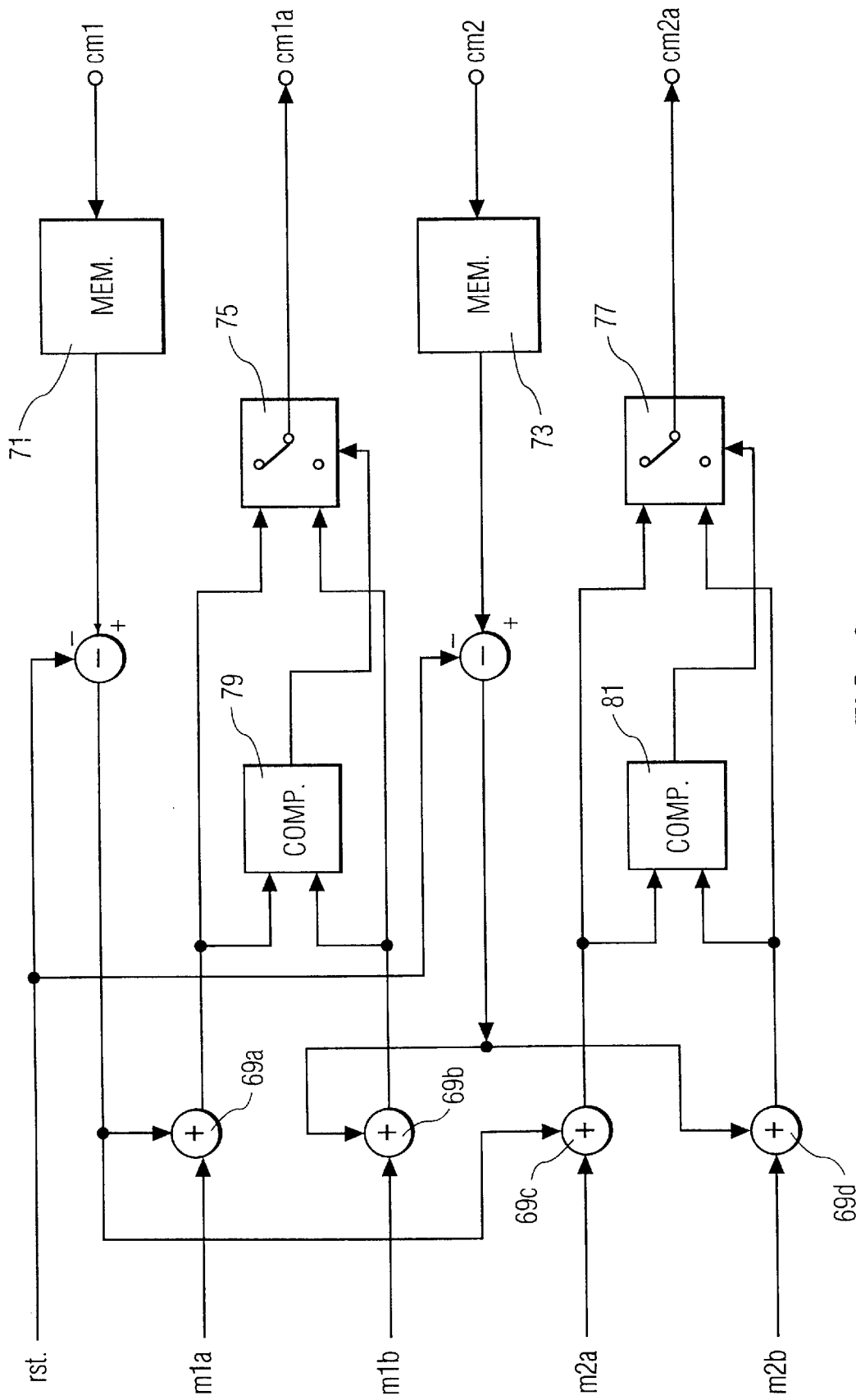
FIG. 9 is a block diagram of each of the two ACS logic units in FIG. 8.

In the circuit implementation shown in FIG. 9 for each of the ACS logic units in FIG. 8, the branch metrics for each of the four subsets are combined by adders 69a–69d with the accumulated path metrics supplied by memory units 71 and 73. The smaller of the resulting path metrics for each of the two groups of lattice states is selected by multiplexers 75 and 77 and output therefrom, and comparators 79 and 81 determine the best survivor path for each group.

BEST METRIC SELECT LOGIC

The survivor path for the entire metric at each stage is determined by the best metric selection logic unit 83 in FIG. 8, for which an exemplary circuit is shown in FIG. 10. It has as inputs the four cumulative path metrics (designated cm 0 to cm 3) and the four survivor predecessor states (designated svr 0 to svr 3). From that information it determines the current survivor path (designated SVR). In addition, it feeds back the value CM of its associated cumulative metric (the smallest among the four) to the ACS logic circuits in order to "normalize" the four cumulative metric computations such that their values remain as small as possible but never less than zero. The identity of the survivor path is output to the traceback unit 63, which uses it to select the specified path from among the four that it maintains.

The exemplary circuit embodiment of the best metric selection logic unit shown in FIG. 10 is essentially a selection tree of successive multiplexers for determining the smallest cumulative metrics and associated survivor paths. The first stage of such selection involves the four multiplexers 85a–85d, succeeded by a second stage consisting of the multiplexers 87a and 87b. The selected cumulative metric and survivor path is output from multiplexers 87a and 87b. The various comparators control multiplexers to select the minimum branch and survivor path metrics.

PATH MEMORY UNIT (PMU)

The path memory unit 62 in the complete decoder in FIG. 6 stores the L (16 in the 8-VSB demodulator) successive predecessor states for each of the four possible current states, and also performs the "traceback" operation for determining the chosen survivor path. It is supplied by ACS unit 61 with the four current survivor predecessor states (svr 0 to svr 3) as well as the current survivor path (SVR), and outputs the corresponding information (designated out 0 to out 3 and A out) for the earliest symbol that it currently stores (L symbols prior to the current one). It is shown in more detail in FIG. 11.

Figure 11:
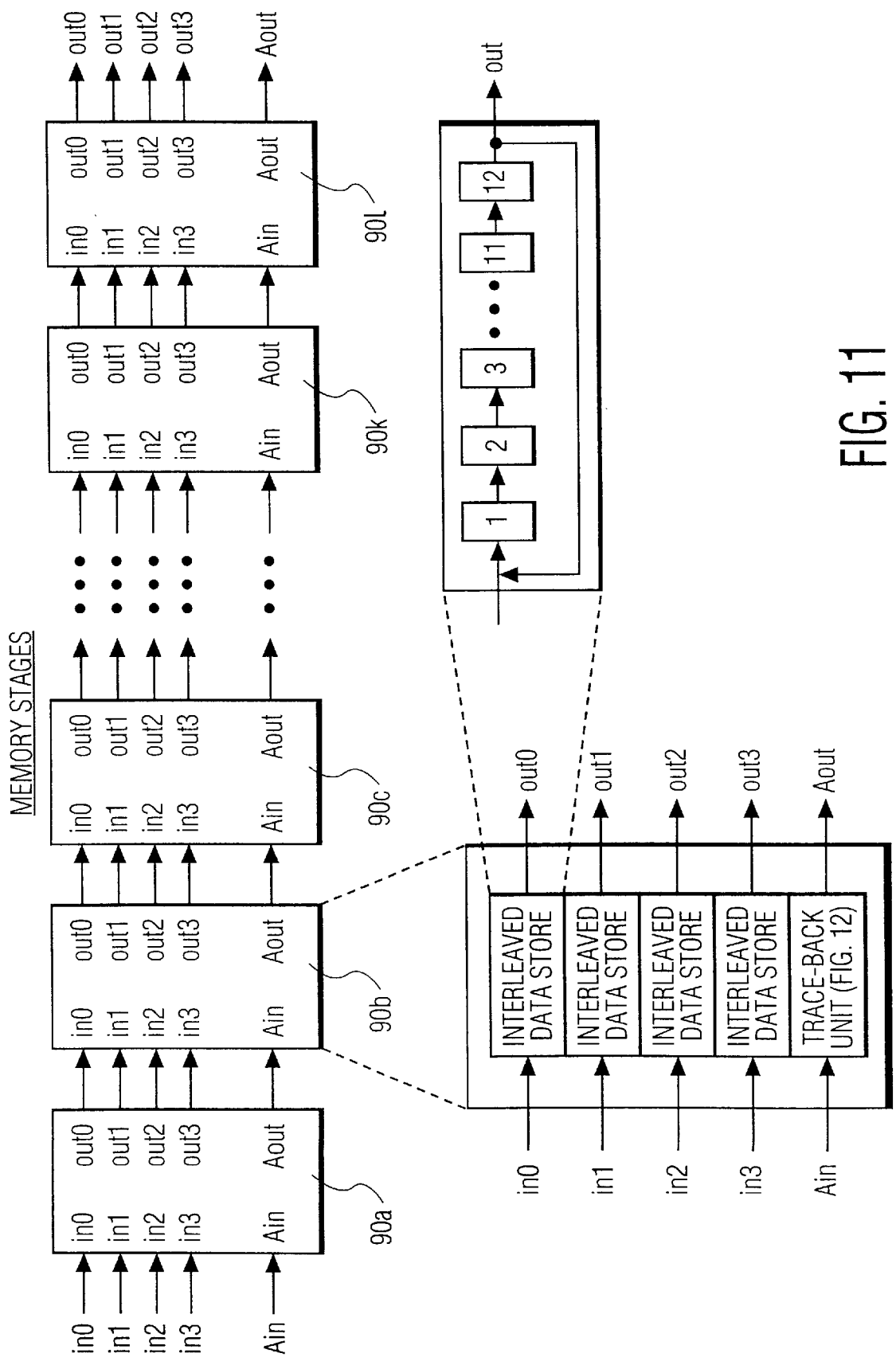
FIG. 11 is a block diagram of the path memory unit (PMU) of the decoder in FIG. 6.

As seen in FIG. 11, the PMU consists of a series of memory stages 90a–90l, one for each of the symbols stored in a path length of L=16 symbols. Each contains, for each of the four possible present trellis states, the predecessor state along that path. It is thus necessary to provide a memory stage delay of one symbol period in the symbol stream for each of the four paths within each storage stage. If only one trellis-coded symbol stream were used, only a single memory stage containing the predecessor state would be needed for each such delay. However, in the GA standard, twelve such separate streams are interleaved in a time division multiplexed fashion as shown in FIG. 3, and these must be decoded independently of each other.

The interleaved data stores and associated traceback unit (as shown in FIG. 11) are shown in exploded view, for example, for memory stage 90b. Therein, each interleaved data store itself consists of 12 registers, one for each of the 12 interleaved symbol streams. That is shown in more detail for the first of the data stores wherein is stored the current survivor predecessor states of each of the interleaved stream.

It will be noted that instead of using 12 complete trellis decoders to decode the 12 interleaved data streams, the described arrangement in accordance with the present invention shares all non-storage components, namely, the branch metric calculator (BMC) and the add-compare-select (ACS) for decoding all of the 12 interleaved streams, since only one symbol is transmitted at any given time. The storage components of the path memory must store the required predecessor states for L path-length symbols for each of the 12 interleaved symbol streams. This is done by implementing each data delay with a shift register having 12 stages, each of which stores one predecessor state. Since only one of every 12 symbols in the interleaved stream are required at any given time, all L storage elements will output states from the same interleaved symbol stream at a given time, with those from the other 11 streams remaining in the internal register elements of the respective data stores such as those of memory stage 90b in the series of L such stages of the PMU. To permit repositioning of the symbol stream during synchronizing intervals of each segment of each data field, recirculation of the 12 stage shift register within each interleaved data delay can be performed during that interval without any processing or decoding taking place. Such sharing of all non-storage elements constitutes a significant feature of the present invention.

Also note that to implement 12 parallel decoders the memory elements used in the ACS block must actually have storage components of 12 stages, similar to that of the PMU, in order to process the 12 parallel interleaved encoded data streams.

Figure 12:
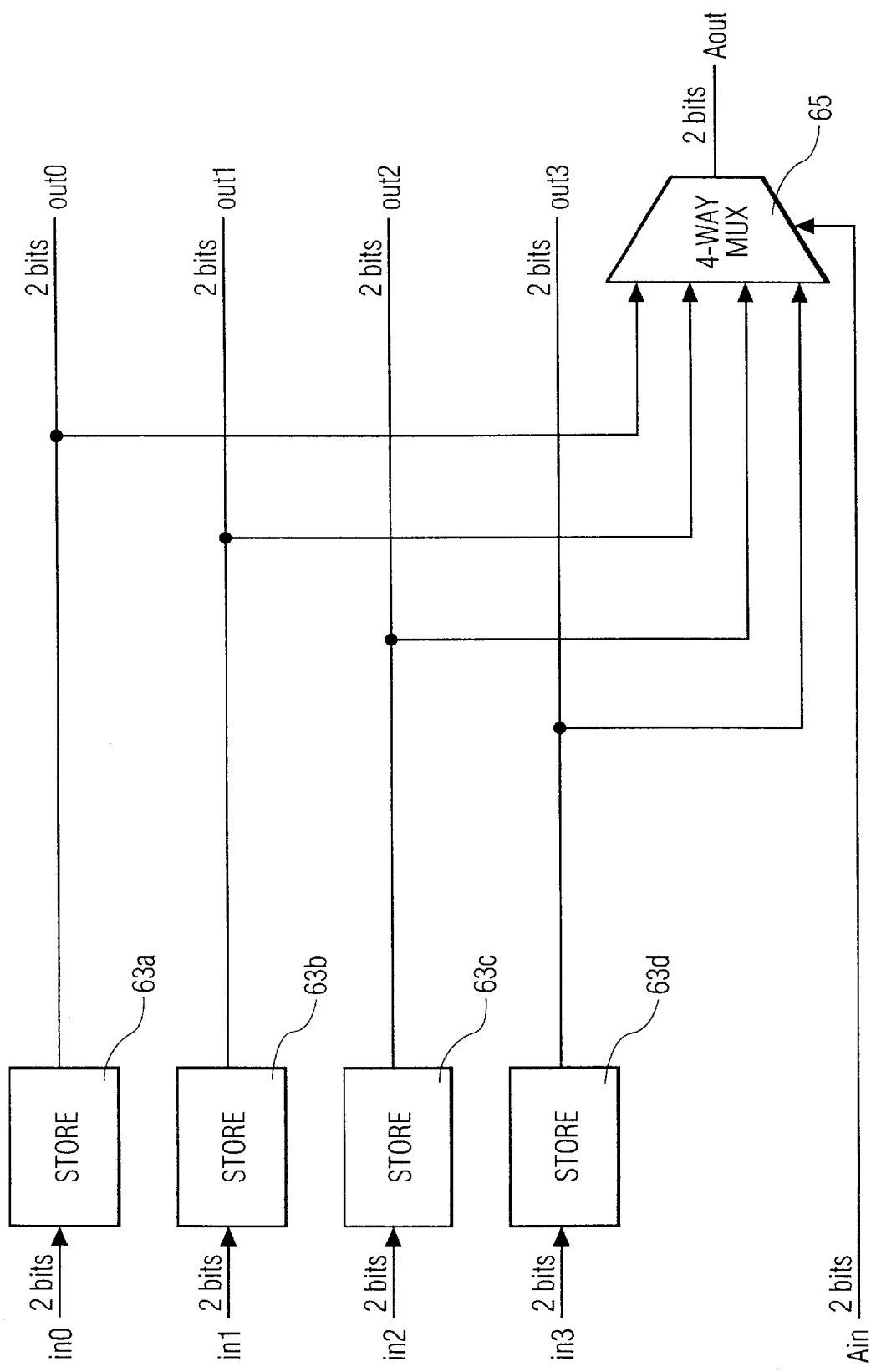
FIG. 12 is a block diagram of the traceback logic unit of the decoder in FIG. 6, FIG. 12a being a block diagram of an alternative form of traceback logic unit.

In order to "trace back" the survivor path, traceback logic is also needed in the path memory unit. One implementation of the traceback logic, specifically applicable to the 4-state code of the GA standard, is shown in FIG. 12. It consists of four memory units 63a–63d respectively for the four input current survivor predecessor states, the outputs of which are combined by a multiplexer 65 with the current survivor path information $A_{in}$ to obtain the new survivor path $A_{out}$.

It should be noted that in the general case of an "n" bit code there will be $2^n$ code states, and storage for each state specifying a pointer to a previous state will require n bits. Consequently, in FIG. 12 those would be $2^n$ storage stages each with a storage capacity of n bits, and $2^n$ inputs to the $2^n$ stages, each input and each output being n bits. In addition, the 4-way multiplexer 65 in FIG. 12 would be a $2^n$-way multiplexer, and of course the current survivor path information $A_{in}$ and $A_{out}$ would each comprise n bits.

Figure 12A:
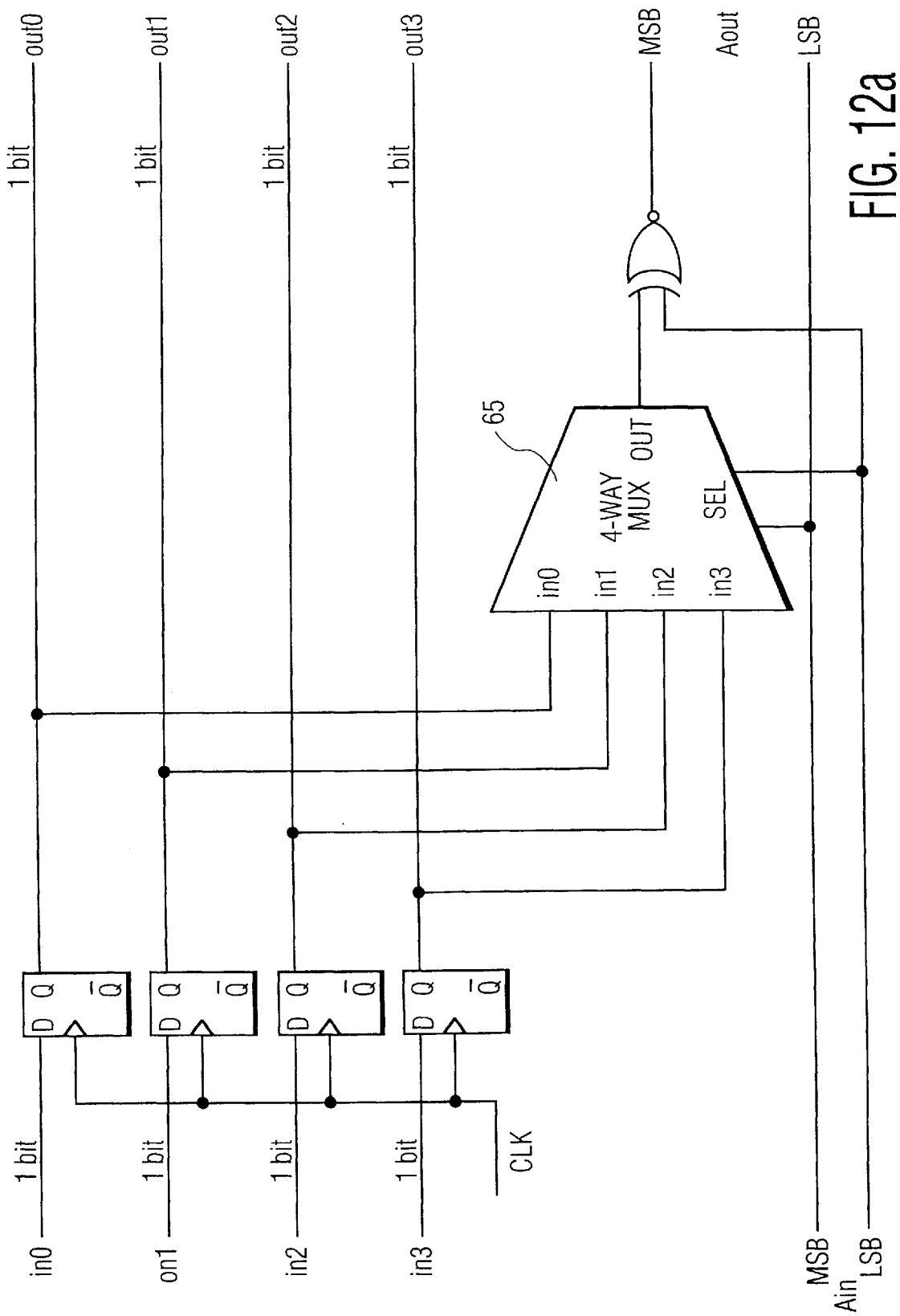

As already mentioned, the trellis diagram of FIG. 5a shows that each code state has only two possible predecessors. Consequently, the predecessor states can be represented using only 1 rather than 2 bits. This will reduce the size of the path memory storage by a factor of two. Since there are still four paths, however, the survivor path selection in the traceback logic will still require two bits. The traceback circuit of FIG. 12 could therefore be simplified by employing only a one-bit storage stage in place of each of the storage units 63a–63d therein, to implement the traceback operation using the one-bit predecessor state representations. Such a simplified design is shown in FIG. 12a, wherein each storage stage is simply a D type flip-flop. An additional advantage of this design is that, when two of these units are cascaded together to perform the next traceback step, the combined propagation delay of the path between $A_{in}$ and $A_{out}$ equals that of one traceback unit as in FIG. 12. Consequently, the traceback portion of the decoding operation may be performed at twice the signal rate. A significant reduction in memory capacity and traceback logic delay will thereby be achieved.

While for the case of a 4-state code the memory requirement is reduced by a factor of two, it is clear that for a $2^n$ state code having the same well-defined property the memory requirement would reduced by a factor of $\log_2 2^n = n$. More generally, a multi-state code having any number s of states will have a required memory of $\log_2 s$ stages.

Figure 13:
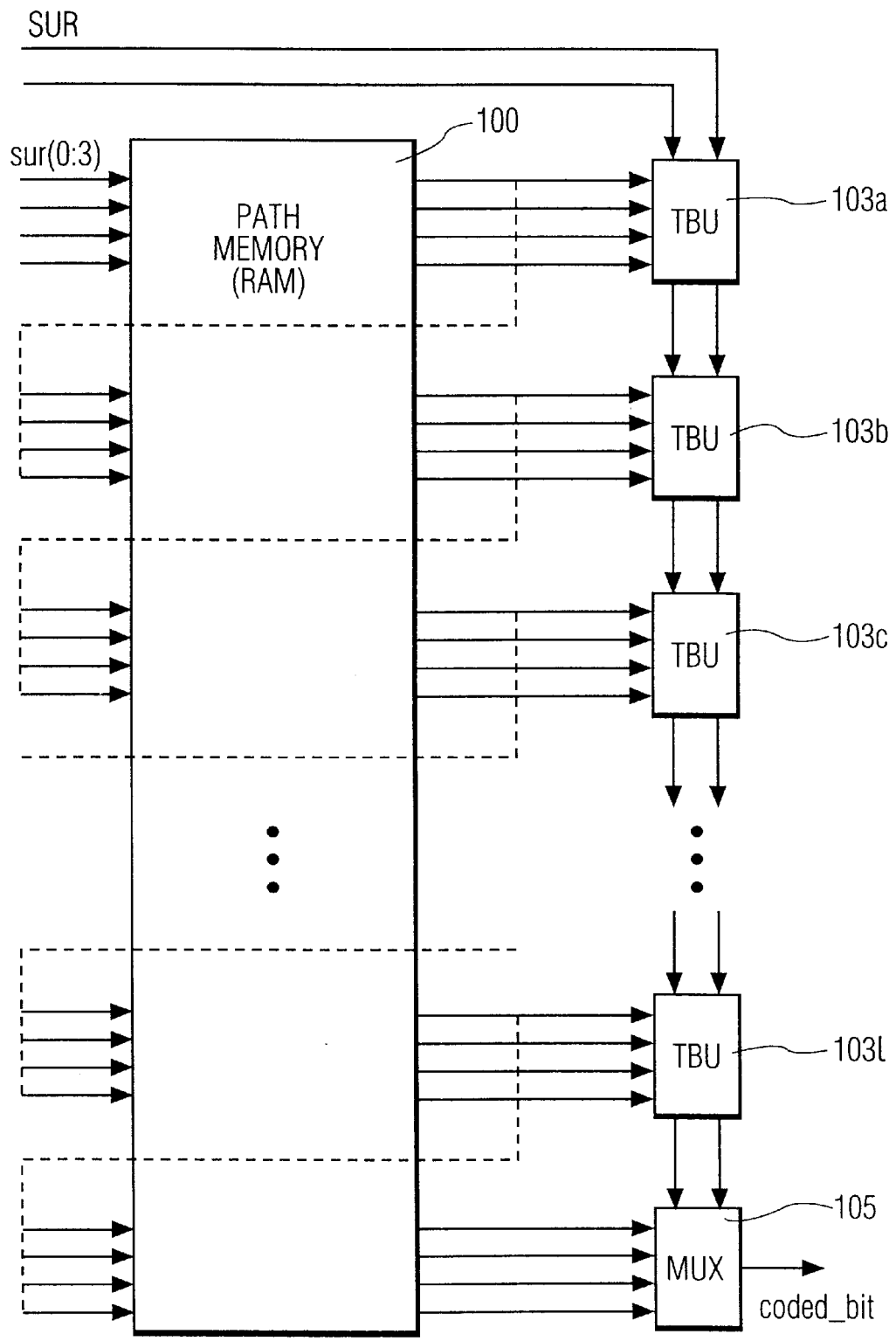
FIG. 13 is a block diagram of an RAM implementation of the path-memory unit (PMU).

Each of the path memory unit stages 90a–90l in FIG. 11 may be practically implemented using data registers having the configurations shown therein, using either two-bit or one-bit predecessor state representation. The number of such registers required, however, becomes fairly large, and will result in the need for a substantial area on a conventional integrated circuit. An alternative architecture for the path memory unit in FIG. 11, using random-access memory (RAM) instead of data registers, is shown in FIG. 13. Therein a wide data word that corresponds to the minimum required trellis transition pointer storage (4 bits) multiplied by the path length L (16) is used (resulting in a word size of 64 bits), so that all predecessor states within all four paths can be simultaneously accessed and traceback can be performed in one symbol interval. The depth of the memory, or the number of locations, corresponds to the number of interleaved trellis-coded symbol streams (12). In addition to requiring less area on an integrated circuit, this arrangement has the advantage that the multiplexed symbol stream can be repositioned very simply since each has its own memory address and so can be accessed in any desired sequence. Consequently, any conceivable interleaving sequence can be used simply by using that sequence to access the memory. It also permits the use of any desired number of interleaved symbol streams to be used by simply increasing the memory depth to the corresponding number of locations.

In FIG. 13, the L stages of the path memory RAM 100 are in the form of successive groups of four bits therein, each group being for the four predecessor states of the current survivor path as described above. The outputs of each successive group are provided in parallel to the inputs of a traceback unit and also written back into the path memory as the preceding group. The current survivor path data is supplied to the first traceback unit 103a, and the corresponding traceback data for traceback units 103b to 103l are passed along from each traceback unit to its successor. The most recent group will be at the top of the data word formed by all groups, and the oldest group will be at the bottom of such data word and serves as the input of multiplexer 105.

A possible modification of FIG. 13, and wherein the symbol data would not change position within the RAM 100, would be to keep track of the group for the most recent predecessor state of the current survivor path by supplying a "pointer" to each of the traceback units 103a and 103l and which is incremented with each successive group. The traceback and output logic, however, would become more complicated even though the data path is slightly simplified; in particular, the speed advantage of the one-bit predecessor state traceback logic element would be lost. Consequently, such modification is not as advantageous as the PMU version shown in FIG. 13.

Actual decoding of the precoded subset bit does not need to be performed, but only selection among one of the four possible values (corresponding to the four trellis states) using the result of the traceback performed by the path memory unit. However, all of such bits need to be delayed by the same number of symbol periods as are in the path length L of the PMU. Since the 12 interleaved symbol streams must be accounted for as well, it is evident that the same amount of symbol storage is required for the subset bit as is used in the PMU. Consequently, the storage architecture used for the PMU can also be used for storage of the subset bit except that each subset bit is always represented by only a single bit. If the one-bit predecessor state representation is used for the PMU, then the storage structure for the subset bit will become identical to that of the PMU. If, in addition, the RAM-based storage architecture as shown in FIG. 13 is used in both cases, it is possible to time-multiplex both operations within a symbol interval and thereby use a single memory having twice the number of memory locations (24) to perform both storage functions. Because of the savings in address decoding and data buffer logic, a single memory of twice the size requires far less area on an integrated circuit than would two smaller but separate memories.

While the invention has been described with reference to certain preferred embodiments thereof, it will be apparent to those skilled in the art that various modifications and adaptations thereof may be made without departing from the basic concept and scope of the invention as defined in the ensuing claims.

What is claimed is:

1. A decoder for decoding, in accordance with the Viterbi algorithm, a received data stream produced by a transmitted time interleaved sequence of a plurality N of respective data streams of trellis encoded digital symbols, where N is an integer each symbol having a plurality of bits, the trellis code having a constellation of permissible code values; said decoder comprising:

a branch metric calculator (BMC) unit for deriving branch metrics between a present received symbol value and code values corresponding to all possible states of the trellis code;

add-compare-select (ACS) means coupled to the BMC unit for deriving from the branch metrics accumulated path metrics of possible predecessor trellis code states going back to a predetermined number of sequentially preceding received symbol values, comparing the accumulated path metrics to determine a most likely survivor path for each of said predecessor states, and selecting an optimum one of all the survivor paths;

a path memory unit (PMU) coupled to the ACS means and having successive storage stages, the outputs of each stage being the inputs of the next succeeding stage; and traceback means coupled to the ACS means for determining the survivor paths going back to the first of said predetermined number of sequentially preceding received symbol values, and determining therefrom the code value of said first of said sequentially preceding received symbol values;

characterized in that the successive storage stages of said PMU respectively store pointers to successive predecessor trellis code states, the number of storage stages corresponds to said predetermined number of sequentially preceding symbol values, each storage stage of the PMU comprises said number N of sequential data storage elements; and the ACS means comprises memory stages each of which has said number N of data storage elements.

2. A decoder as claimed in claim 1, wherein:

the trellis code states fall into a plurality of respective groups such that for a present code state in any one of said groups all possible predecessors of that code state also fall within that same one of said groups; and the ACS means comprises respective ACS units for the respective groups, each ACS unit operating on branch metrics and path metrics of only those trellis states which fall within its assigned group;

each of said ACS units thereby being of simpler design than would be a single ACS unit for operating on branch metrics and path metrics of possible trellis states in all of said groups.

3. A decoder as claimed in claim 2, wherein there are four trellis code states which fall into first and second groups; and the ACS means comprises first and second ACS units respectively for the first and second groups.

4. A decoder as claimed in claim 1, wherein the PMU is in the form of an integrated random access memory (RAM), the storage elements and data stores of the PMU being respective storage locations in said RAM.

5. A decoder as claimed in claim 1, wherein the trellis code is such that any present code state can only have resulted from a relatively small number s of possible predecessor code states; and the number of storage elements per pointer of the PMU is the smallest integer equal to or greater than $\log_2 s$.

6. A decoder as claimed in claim 5, wherein the trellis code states fall into a plurality of respective groups such that for a present code state in any one of said groups all possible predecessors of that code state also fall within that same one of said groups; whereby the PMU can employ simplified combinational logic circuits to determine the pointers to be stored therein.

7. A decoder as claimed in claim 5, wherein the PMU is in the form of an integrated random access memory (RAM), the storage stages and storage elements of the PMU being respective storage locations in said RAM.

8. A decoder as claimed in claim 6, wherein the PMU is in the form of an integrated random access memory (RAM), the storage stages and storage elements of the PMU being respective storage locations in said RAM.

9. A decoder as claimed in claim 6, wherein the trellis code has only four possible states.

10. A decoder as claimed in claim 6, wherein each of said storage elements stores a single bit per pointer.

11. A decoder as claimed in claim 8, wherein each of said storage elements stores a single bit per pointer.

12. A decoder as claimed in claim 1, wherein the trellis code has only four possible states.

13. A decoder as claimed in claim 12, wherein said number N=12.

14. A receiver for a digital high definition television (HDTV) video signal in which video data is included in successive fields, each field having successive segments, each segment having a series of trellis encoded interleaved 3-bit codewords derived from 2-bit datawords, one bit of each codeword being precoded in correspondence with one bit of a data word and the other two bits of said codeword resulting from trellis encoding of the second bit of said data word in accordance with a 4-state trellis code, each 3-bit codeword representing a value in a constellation of eight possible values each of which corresponds to one of four subsets each having two permissible values, the applicable value being determined by said precoded bit of each codeword, the codewords being interleaved to form twelve separate time division multiplexed codeword streams; said receiver comprising a decoder for decoding, in accordance with the Viterbi algorithm, the twelve interleaved streams of trellis encoded codewords; said decoder comprising:

a branch metric calculator (BMC) unit for deriving branch metrics between a present received codeword code value and code values corresponding to the four possible states of the trellis code;

add-compare-select (ACS) means coupled to the BMC unit for deriving from the branch metrics accumulated path metrics of possible predecessor trellis code subset states going back to a predetermined number of sequentially preceding received codewords, comparing the accumulated path metrics to identify a most likely survivor path for each of said predecessor states, and selecting an optimum one of all the survivor paths; said ACS means having successive storage stages;

a path memory unit (PMU) coupled to the ACS means and also having successive storage stages, the outputs of each stage being the inputs of the next succeeding stage; and traceback means coupled to the ACS means for determining the survivor paths going back to the first of said predetermined number of sequentially preceding received codewords, and determining therefrom the trellis code value of said first of said sequentially preceding codewords;

characterized in that the successive storage stages of said PMU respectively store pointers to successive predecessor trellis states, the number of said storage stages corresponds to said predetermined number of sequentially preceding received codewords, and each storage stage of the PMU and of the ACS means comprises twelve sequential data storage elements corresponding to the number of multiplexed codeword streams.

15. A receiver as claimed in claim 14, wherein:

the trellis code states fall in first and second groups such that for a present code state in either of said groups all possible predecessors of that code state also fall within the same group; and the ACS means comprises first and second ACS units, the first ACS unit operating on branch metrics and path metrics of only those trellis states which fall within said first group, and the second ACS unit operating on branch metrics and path metrics of only those trellis states which fall within said second group;

each of said ACS units thereby being of simpler design than would be a single ACS unit for operating on branch and path metrics of possible trellis states in both of said groups.

16. A receiver as claimed in claim 14, wherein the PMU is in the form of an integrated random access memory (RAM), the storage elements and data stores of the PMU being respective storage locations in said RAM.

17. A receiver as claimed in claim 16, wherein each of said storage elements stores a single bit per pointer.

18. A receiver as claimed in claim 14, wherein said traceback means stores each of the survivor paths in the form of a single bit per pointer, and a best survivor path at any given traceback step is determined with reference to only one bit of a 2-bit valuation of a best survivor path up to a next preceding traceback step.

19. A receiver as claimed in claim 18, wherein the propagation delay of combinational logic circuits comprised in said traceback means is reduced by a factor of two by providing for storage of only a single bit for each subset of the trellis code states.

20. A receiver as claimed in claim 14, wherein said number of sequentially preceding received codewords for which said BMC unit derives branch metrics is equal to 16.

* * * * *